United States Patent
Lu et al.

(10) Patent No.: US 7,966,596 B2
(45) Date of Patent: Jun. 21, 2011

(54) PLACE-AND-ROUTE LAYOUT METHOD WITH SAME FOOTPRINT CELLS

(75) Inventors: Lee-Chung Lu, Taipei (TW); Chung-Hsing Wang, Baoshan Township, Hsinchu County (TW); Ping Chung Li, HsinChu (TW); Chun-Hui Tai, HsinChu (TW); Li-Chun Tien, Tainan (TW); Gwan Sin Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 360 days.

(21) Appl. No.: 12/199,617

(22) Filed: Aug. 27, 2008

(65) Prior Publication Data
US 2010/0058267 A1 Mar. 4, 2010

(51) Int. Cl.
*G06F 17/50* (2006.01)
*G06F 11/22* (2006.01)

(52) U.S. Cl. ........................................ 716/119; 716/100
(58) Field of Classification Search .................. 716/100, 716/119
See application file for complete search history.

(56) References Cited

U.S. PATENT DOCUMENTS

| | | | | |
|---|---|---|---|---|
| 5,737,236 A * | 4/1998 | Maziasz et al. | ................... | 716/8 |
| 2003/0229860 A1* | 12/2003 | Li | ..................... | 716/1 |
| 2009/0064072 A1* | 3/2009 | Lin et al. | .......................... | 716/8 |
| 2009/0265675 A1* | 10/2009 | Walker et al. | ..................... | 716/9 |
| 2009/0271756 A1* | 10/2009 | Penzes | ............................ | 716/17 |

* cited by examiner

*Primary Examiner* — Thuan Do
*Assistant Examiner* — Magid Y Dimyan
(74) *Attorney, Agent, or Firm* — K&L Gates LLP

(57) ABSTRACT

This invention discloses a method for automatically generating an integrated circuit (IC) layout, the method comprises determining a first cell height, creating a plurality of standard cells all having the first cell height, and generating the IC layout from the plurality of standard cells by placing and routing thereof.

17 Claims, 4 Drawing Sheets

PLACE-AND-ROUTE LAYOUT METHOD WITH SAME FOOTPRINT CELLS

BACKGROUND

The present invention relates generally to an automated integrated circuit (IC) layout method, and, more particularly, to a place-and-route method that utilizes the same footprint and gridded library cells.

Many ICs, particularly those application-specific integrated circuit (ASIC) and field programmable gate arrays, utilize automation tools to generate layout from small cell blocks. Such automated tools place these pre-built small cell blocks and route interconnects among them according to a designer's specifications.

FIG. 1 is block diagram illustrating a conventional standard cell library 102 for use in a place-and-route layout creation. In order to accommodate different driving capabilities, the conventional standard cell library 102 may include cells of different heights, such as a cell 110 has seven tracks, a cell 120 has nine tracks and a cell 130 has eleven tracks. Here the word, track, is used to describe the cell height. A track is typically referred to one contact pitch. A seven-track cell means that a transistor channel width in the cell is seven contact pitch wide. When these cells 110, 120 and 130 of different heights are used in place-and-route layout creation, a consideration of larger driving capability requires taller cells, while a consideration of low leakage and low power demands shorter cells. Mixing tall cells with shorter cells will sacrifice layout area utilization, as tall cells demand greater area for cell placement and/or tiling.

As such, what is desired is a place-and-route method that uses cells having the same height and thus having the same footprint for optimizing layout arrangement.

SUMMARY

This invention discloses a method for automatically generating an integrated circuit (IC) layout, the method comprises determining a first cell height, creating a plurality of standard cells all having the first cell height, and generating the IC layout from the plurality of standard cells by placing and routing thereof. The standard cells may have different width. They are generally placed in a grid so that a large number of contacts are aligned.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

The present invention discloses an integrated circuit (IC) place-and-route layout method that utilizes library cells having the same height and thus having the same footprint for optimizing layout arrangement.

Figure 1:
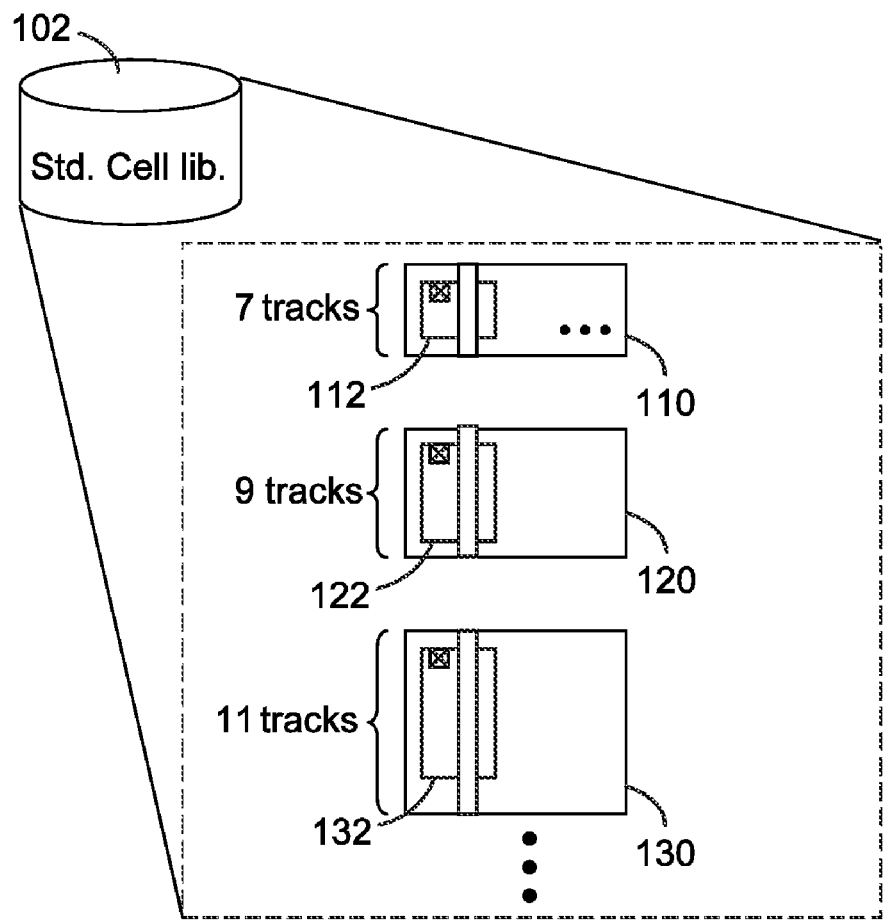
FIG. 1 is block diagram illustrating a conventional standard cell library for use in a place-and-route layout creation.
Figure 2:
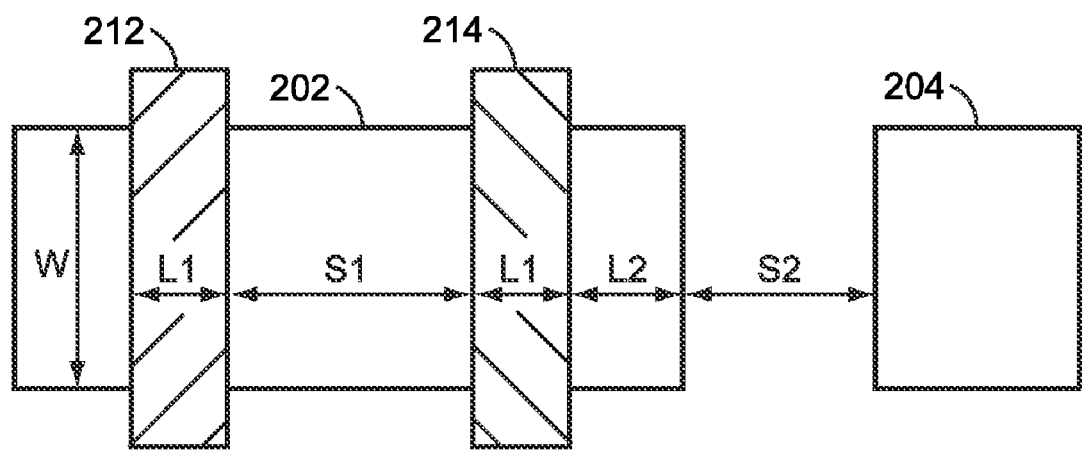
FIG. 2 is a layout diagram illustrating some critical layout dimensions.

FIG. 2 is a layout diagram illustrating some critical layout dimensions. Diffusion regions are represented by blocks 202 and 204. Polysilicon gates are represented by blocks 212 and 214. A width of the polysilicon gate 212 or 214, L1, is a channel length of a transistor device formed by the polysilicon gate 212 or 214 and the diffusion region 202. A width of the diffusion region 202 under the polysilicon gate 212 or 214, W, is a channel width of the above transistor device. A distance between the polysilicon gates 212 and 214, S1, is a polysilicon spacing. A distance between the two diffusion regions 202 and 204, S2, is a diffusion spacing. An extension by the diffusion region 212 over the polysilicon gate 214, L2, is a length of diffusion.

Different circuit design goals may require different device and thus layout properties. In a case when high performance, i.e., high driving capability is a primary concern, the device channel length L1 should be kept at minimum and device channel width W should be optimized. In another case when low leakage is a primary concern, the channel length L1 should be longer than the minimum. Following TABLE 1 summarizes key device dimension selection criteria for different applications.

TABLE 1

|  | L1 | S1 | L2 | S2 |
|---|---|---|---|---|
| High performance | Short | Long | Long | Long |
| Low leakage | Long | Short | Short | Short |

Figure 3:
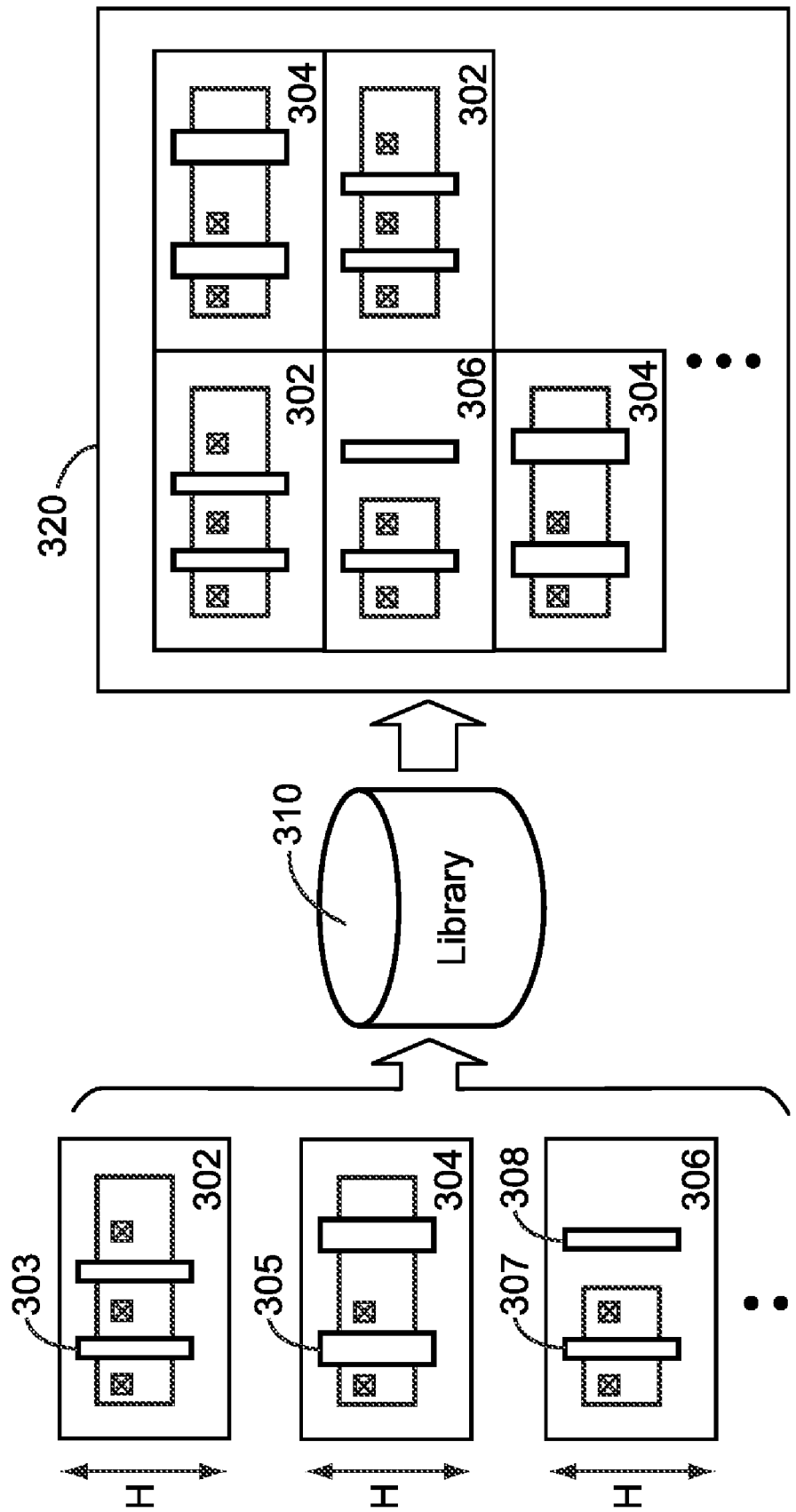
FIG. 3 is a block diagram illustrating a library cell creation process and how the library is applied by place-and-route method in creating an IC layout according to one embodiment of the present invention.

FIG. 3 is a block diagram illustrating a library cell creation process and how the library is applied by a place-and-route method in creating an IC layout according to one embodiment of the present invention. In creating standard cells for a library 310, an optimized cell height H is chosen for all the standard cells 302, 304 and 306. The standard cell 302 is for high performance device with a short channel length 303. The standard cell 304 is for low leakage device with long channel length 305. The standard cell 306 represents other applications. An exemplary feature is a dummy polysilicon piece 306, which serves not as a device gate but as a balance for even loading during a polysilicon etching process. A skilled in the art would realize that other layers such as diffusion and metal can also be specially treated, i.e., adding dummy pieces to empty spaces. The various standard cells 302, 304 and 306 always have the same height H, but their width may vary. When a cell 302, 304 or 306 requires higher driving capability, more fingers may be added, and thus extending the width of the standard cell 302, 304 or 306.

Referring again to FIG. 3, a block or a chip level layout 320 is created by a place-and-route method using the standard cells 302, 304, and 306 in the library 310. Because all the standard cells 302, 304 and 306 have identical cell height H, the cell arrangement can be gridded and thus taking less layout area and cells can be easily replaced. Further more, because the cells are arranged in a grid, their contacts are more likely to be aligned both vertically and horizontally, this makes interconnect routing easier. In modern ICs, the layout areas are more often limited by spaces for interconnects than for device areas.

Figure 4:
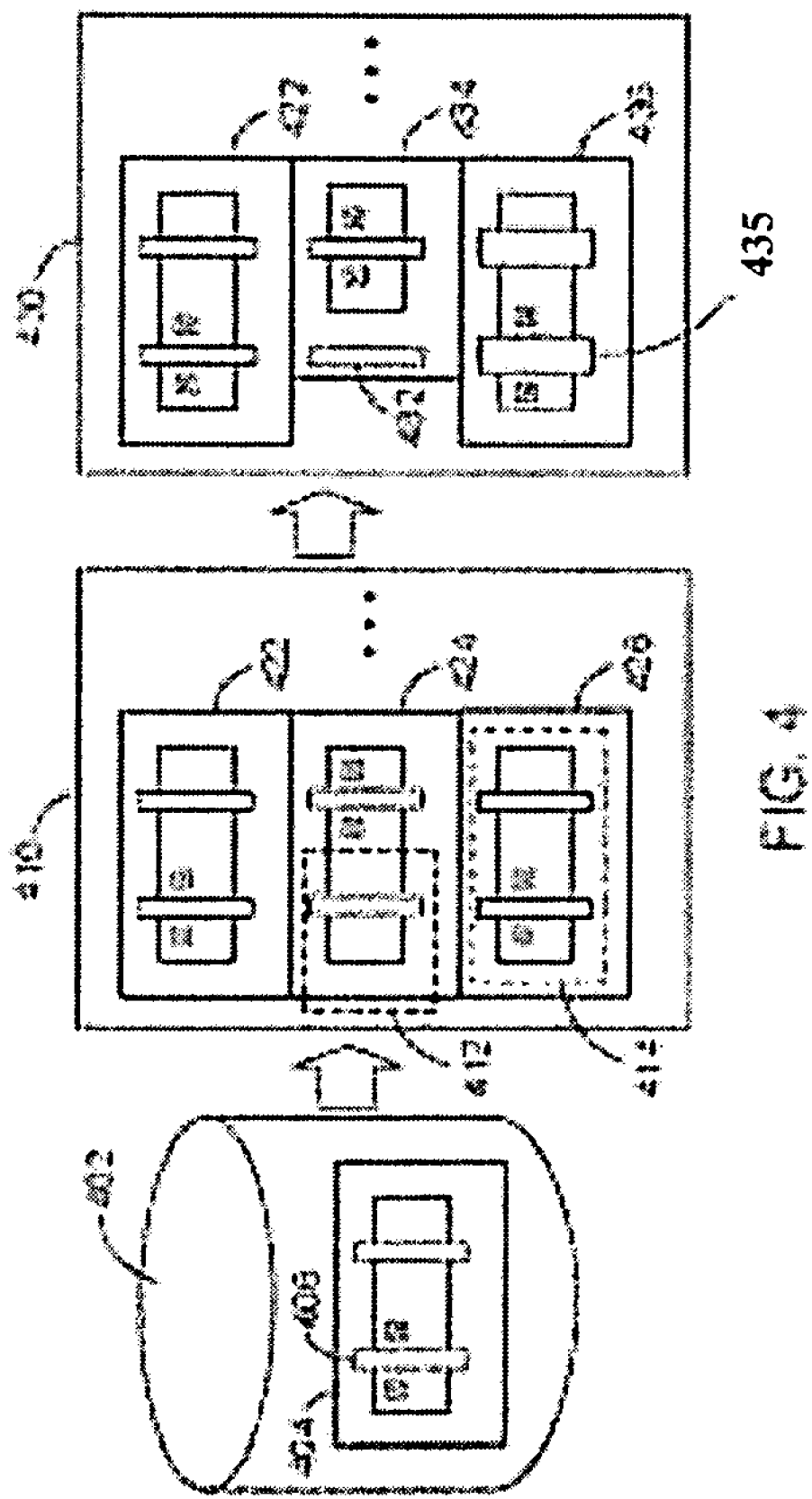
FIG. 4 is a block diagram illustrating an alternative place-and-route method according to the embodiment of the present invention.

FIG. 4 is a block diagram illustrating an alternative place-and-route method according to an exemplary of embodiment of the present invention. Like the method shown in FIG. 3, an optimized cell height is first chosen, and based on which a standard cell 404 is created for the cell library 402. The standard cell 404 has a standard transistor channel length 406. The cell library 402 does not have different standard cells catering to different performance requirements like the high performance or low leakage ones shown in FIG. 3. For satisfying different performance requirements, a marker layer having patterns 412 and 414 is used during a block or chip level layout creation by a place-and-route method. Such marker layer patterns 412 and 414 are shown in a transitional layout 410. A logic operation is then performed on a database containing the transitional layout 410 and produces a final layout 430. In the final layout 430, a cell 422 remains the same from the transitional layout 410, cells 434 and 436 are transformed from cells 424 and 426 in the transitional layout 410. The cell 422 is a standard cell which maximized speed performances. The cell 434 illustrates removing an unwanted transistor but leaving the polysilicon gate 432 in place as a dummy structure which balances the polysilicon etching process. The cell 436 caters to leakage application by widening transistor channel length 435. An end result by the method shown in FIG. 4 is the same as that by the method shown in FIG. 3. The method of FIG. 3 directly creates various standard cells 302, 304, and 306 in the library 310. The method of FIG. 4 uses marker layer and logic operations for generating different transistor categories.

Figure 5:
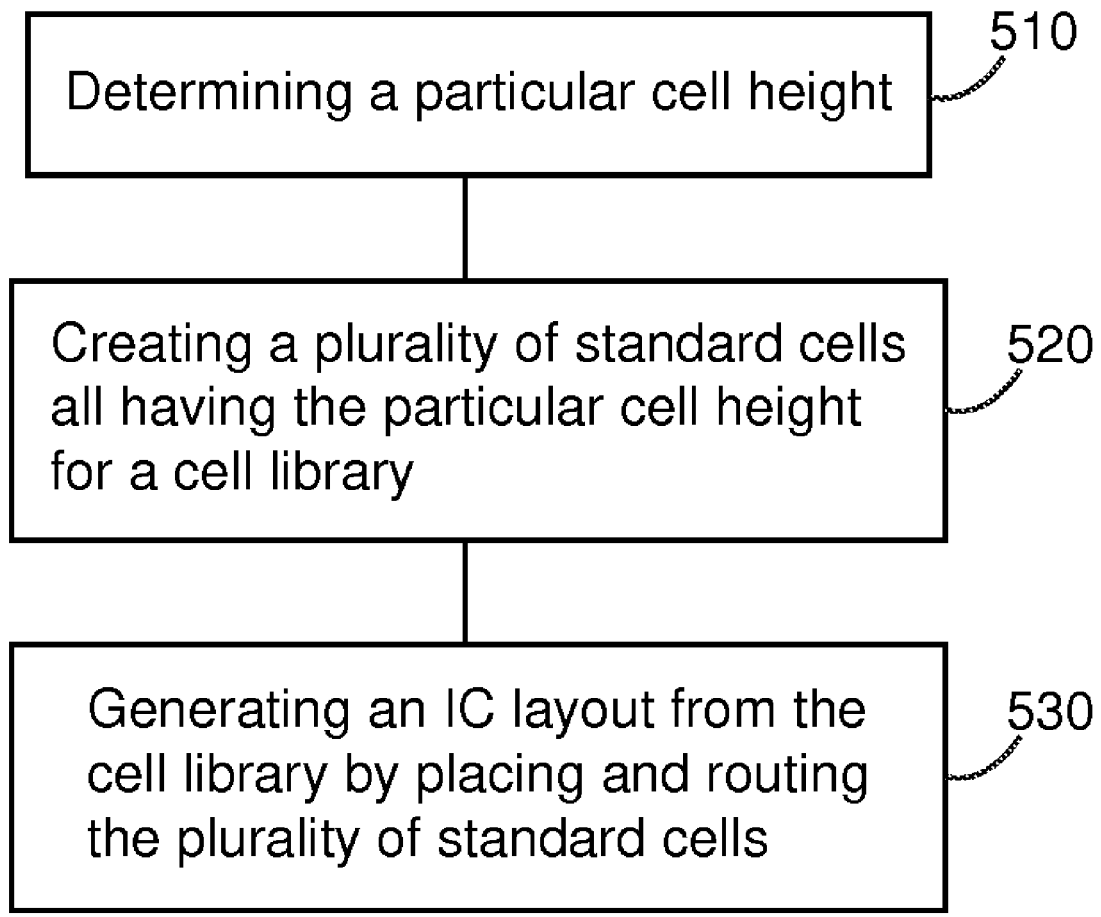
FIG. 5 is a flow-chart diagram summarizing the process of creating an IC layout according to the embodiment of the present invention.

FIG. 5 is a flow-chart diagram summarizing the process of creating an IC layout according to the embodiment of the present invention. The process begins with step 510 in which a particular cell height is determined from considerations of various device performance requirements, such as high speed and low leakage, etc. Then a plurality of standard cells all having the particular cell height is created for a cell library in step 520. The IC layout is generated automatically by a place-and-route program using the plurality of stand cells in step 530. The place-and-route program may use one or more marker layers to mark out special devices and employ logic operations to make desired layout changes.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for automatically generating an integrated circuit (IC) layout in an IC design, the method comprising:
   determining a first cell height;
   creating a plurality of standard cells all having the first cell height; and
   generating, using a layout tool, the IC layout from the plurality of standard cells by placing and routing thereof, wherein the generating includes:
   creating a transitional layout; and
   applying one or more logic operations on the transitional layout to make desired layout changes for creating a final IC layout, wherein the desired layout changes includes increasing a transistor channel length and inserting a dummy structure.

2. The method of claim 1, wherein the determining the first cell height includes accommodating both high performance and low leakage devices.

3. The method of claim 1, wherein at least two standard cells of the plurality of standard cells have different cell widths.

4. The method of claim 1, wherein transistors in at least two standard cells of the plurality of standard cells have different channel lengths.

5. The method of claim 1, wherein at least one of the standard cells includes dummy polysilicon gate.

6. The method of claim 1, wherein the plurality of standard cells is placed in a grid so that contacts in the plurality of standard cells are aligned and the standard cells can be easily replaced.

7. The method of claim 1, wherein the one or more logic operations are performed on the database extracted from the transitional layout.

8. A method for automatically generating an integrated circuit (IC) layout in an IC design, the method comprising:
   determining a first cell height accommodating both high performance and low leakage devices;
   creating a plurality of standard cells all having the first cell height; and
   generating, using a layout tool, the IC layout from the plurality of standard cells by placing and routing thereof, wherein the generating includes:
   creating a transitional layout; and
   applying one or more logic operations on the transitional layout to make desired layout changes for creating a final IC layout, wherein the desired layout changes includes increasing a transistor channel length and inserting a dummy structure.

9. The method of claim 8, wherein at least two standard cells of the plurality of standard cells have different cell widths.

10. The method of claim 8, wherein transistors in at least two standard cells of the plurality of standard cells have different channel lengths.

11. The method of claim 8, wherein at least one of the standard cells include dummy polysilicon gate.

12. The method of claim 8, wherein the plurality of standard cells is placed in a grid so that contacts in the plurality of standard cells are aligned and the standard cells can be easily replaced.

13. The method of claim 8, wherein the one or more logic operations are performed on the database extracted from the transitional layout.

14. A method for automatically generating an integrated circuit (IC) layout in an IC design, the method comprising:

determining a first cell height;
creating a plurality of standard cells all having the first cell height; and
generating, using a layout tool, the IC layout from the plurality of standard cells by placing and routing thereof in a grid, wherein the generating includes:
creating a transitional layout; and
applying one or more logic operations on the transitional layout to make desired layout changes for creating a final IC layout, wherein the desired layout changes includes increasing a transistor channel length and inserting a dummy structure, and
wherein contacts in the plurality of standard cells are aligned and the standard cells can be easily replaced.

15. The method of claim 14, wherein the determining the first cell height includes accommodating both high performance and low leakage devices.

16. The method of claim 14, wherein at least two standard cells of the plurality of standard cells have different cell widths.

17. The method of claim 14, wherein at least one of the standard cells includes dummy polysilicon gate.

* * * * *